(12) United States Patent
Lee et al.

(10) Patent No.: US 9,537,097 B2
(45) Date of Patent: Jan. 3, 2017

(54) SUBSTRATE FOR ORGANIC ELECTRONIC DEVICE

(71) Applicant: LG DISPLAY CO., LTD, Seoul (KR)

(72) Inventors: Yeon Keun Lee, Daejeon (KR); Kyoung Sik Moon, Daejeon (KR); Seong Soo Jang, Daejeon (KR); Yong Sik Ahn, Seoul (KR); Jung Doo Kim, Daejeon (KR); Min Choon Park, Daejeon (KR); Jung Bum Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/036,858

(22) Filed: Sep. 25, 2013

(65) Prior Publication Data

US 2014/0051207 A1 Feb. 20, 2014

Related U.S. Application Data

(63) Continuation of application No. PCT/KR2012/002338, filed on Mar. 29, 2012.

(30) Foreign Application Priority Data

Mar. 29, 2011 (KR) .................. 10-2011-0028091
Oct. 7, 2011 (KR) .................. 10-2011-0102473

(51) Int. Cl.
*H01L 51/00* (2006.01)
*H01L 51/52* (2006.01)
(Continued)

(52) U.S. Cl.
CPC ......... *H01L 51/0023* (2013.01); *H01L 51/003* (2013.01); *H01L 51/0096* (2013.01);
(Continued)

(58) Field of Classification Search
CPC .... H01L 51/42; H01L 51/5268; H01L 25/046; H01L 51/50; H01L 27/30; H01L 2221/68386
See application file for complete search history.

(56) References Cited

U.S. PATENT DOCUMENTS 4,774,435 A * 9/1988 Levinson ................. 313/509
5,043,363 A    8/1991 Noguchi et al.
(Continued)

FOREIGN PATENT DOCUMENTS

CN    101870218 A    10/2010
CN    101926018 A    12/2010
(Continued)

OTHER PUBLICATIONS

Office Action Japanese Patent Office in Appl'n No. 2014-502475, dated Oct. 28, 2014.
U.S. Appl. No. 14/052,611, dated Oct. 11, 2013.

*Primary Examiner* — Evren Seven
*Assistant Examiner* — Alia Sabur
(74) *Attorney, Agent, or Firm* — Dentons US LLP

(57) ABSTRACT

The present invention relates to a substrate for an organic electrode device, a manufacturing method thereof, and an organic electronic device. An exemplary substrate of the invention, if an organic light emitting element is formed on an upper part of the substrate, can obtain luminance with high emission and uniformity by efficiently controlling the surface resistance of an electrode even when the device is configured into larger sizes.

9 Claims, 6 Drawing Sheets

(51) Int. Cl.
  *H01L 51/42* (2006.01)
  *H01L 51/50* (2006.01)

(52) U.S. Cl.
  CPC .......... *H01L 51/5268* (2013.01); *H01L 51/42* (2013.01); *H01L 51/50* (2013.01); *H01L 51/5212* (2013.01); *H01L 51/5228* (2013.01); *H01L 51/5262* (2013.01); *Y02E 10/549* (2013.01); *Y02P 70/521* (2015.11)

(56) References Cited

U.S. PATENT DOCUMENTS

| | | | |
|---|---|---|---|
| 5,421,926 A * | 6/1995 | Yukinobu et al. | 156/83 |
| 2006/0139749 A1 | 6/2006 | Watanabe et al. | |
| 2007/0079869 A1* | 4/2007 | Yukinobu | 136/263 |
| 2007/0200496 A1* | 8/2007 | Cok et al. | 313/512 |
| 2009/0052195 A1* | 2/2009 | Saneto et al. | 362/355 |
| 2013/0004753 A1* | 1/2013 | Majumdar et al. | 428/209 |

FOREIGN PATENT DOCUMENTS

| | | |
|---|---|---|
| JP | 5-325646 A | 12/1993 |
| JP | 5325646 A | 12/1993 |
| JP | 11-338055 A | 12/1999 |
| JP | 2004-151592 A | 5/2004 |
| JP | 2005-353367 | 12/2005 |
| JP | 2009-110930 | 5/2009 |
| JP | 2009-128764 A | 6/2009 |
| JP | 2009-146640 | 7/2009 |
| JP | 2009146640 A * | 7/2009 |
| JP | 2013-501342 A | 1/2013 |
| KR | 10-2010-0106412 | 10/2010 |
| WO | 2005/041217 A1 | 5/2005 |
| WO | 2009/071822 | 6/2009 |
| WO | 2010/018733 A1 | 2/2010 |
| WO | 2011/016725 A1 | 2/2011 |

* cited by examiner

SUBSTRATE FOR ORGANIC ELECTRONIC DEVICE

This application is a Continuation Bypass of International Application No. PCT/KR2012/002338, filed Mar. 29, 2012 and, claims priority to and the benefit of Korean Patent Application Nos. 10-2011-0028091, filed on Mar. 29, 2011, and 10-2011-0102473, filed on Oct. 7, 2011 the disclosures of which are incorporated herein by reference in their entirety.

TECHNICAL FIELD

The present invention relates to a substrate for an organic electronic device, a method of manufacturing the substrate, and an organic electronic device.

BACKGROUND ART

An organic electronic device (OED) may be a device exhibiting various functions through exchange of charges between an electrode and an organic material, and for example of the OED may be included an organic light emitting device (OLED), an organic solar cell, an organic photo conductor (OPC) or an organic transistor and the like.

In the OED, electrode characteristics are very important. For example, an OLED used as lighting is conventionally composed of a pixel having an emitting area in which a length of one side is 5 cm or more. Since the OLED has a large emitting area as described above, if a sheet resistance of an electrode is high, electrons or holes are not uniformly injected throughout an entire area, thereby generating an emitting spot, or uniform luminance may not be obtained from an entire emitting region.

Conventionally, the OED includes two electrodes, at least one of which is a transparent electrode to facilitate extraction or incidence of light. Particularly, the transparent electrode may not have an excessively high thickness to ensure transparency, and thus it is not easy to control the sheet resistance.

DISCLOSURE

Technical Problem

The present invention is directed to providing a substrate for an OED, a method of manufacturing the substrate, and an OED.

Technical Solution

One aspect of the present invention provides a substrate for an OED, which may include: a substrate; an adhesive layer formed on a main surface of the substrate; and a conductive pattern recessed in the adhesive layer. Here, the conductive pattern is exposed to a surface of the adhesive layer opposite to a surface the substrate, and the opposite surface of the adhesive layer including the surface of the exposed conductive pattern forms a planarized surface having a maximum height roughness of 1 μm or less.

Another aspect of the present invention provides a method of manufacturing the substrate for an OED, which may include: forming a conductive pattern on a release surface of a releasable substrate; forming a precursor material of an adhesive layer on the substrate on which the conductive pattern is formed; laminating the precursor material of the adhesive layer and the substrate, and converting the precursor material into the adhesive layer; and removing the releasable substrate.

Advantageous Effects

When an OLED is formed above an exemplary substrate of the present invention, even when the OLED is formed in a large size, the substrate can ensure excellent luminance and emission uniformity by efficiently controlling a sheet resistance of an electrode.

MODE FOR INVENTION

An exemplary substrate for an OED of the present invention may include a substrate, an adhesive layer formed on a main surface of the substrate, and a conductive pattern recessed in the adhesive layer. Here, the conductive pattern is exposed to a surface of the adhesive layer opposite to a surface of the substrate, and the opposite surface of the adhesive layer including the surface of the exposed conductive pattern forms a planarized surface having a maximum height roughness of 1 μm or less.

The term "planarized surface" or "opposite surface" used herein may refer to a surface formed by the surface of the adhesive layer on the side in which the conductive pattern is exposed and the exposed surface of the conductive pattern in a structure of the substrate. In addition, here, the surface of the adhesive layer may refer to not only a surface of an adhesive itself but also a surface of the surface layer, for example, when the adhesive layer includes a surface layer as will be described later.

In one embodiment, the planarized surface may be a planarized surface on which an OED is formed.

Figure 1:
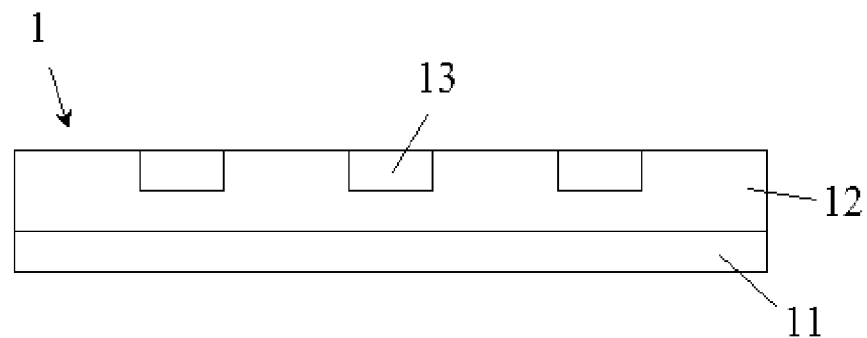
FIGS. 1 to 3 are schematic diagrams of an exemplary substrate.

FIG. 1 shows a structure of an exemplary substrate (1), which includes a substrate (11), an adhesive layer (12) formed on the substrate (11), and a conductive pattern (13) recessed in the adhesive layer (12).

As the substrate, a suitable material may be used as needed without particular limitation. In one embodiment, when the OED is a bottom-emissive OLED, the substrate may be a transparent substrate, for example, a substrate having a light transmittance of 50% or more, 60% or more, 70% or more or 50 to 98% in a visible region, for example, a range of a wavelength of 400 nm to 700 nm. As the transparent substrate, a glass substrate or a transparent polymer substrate may be used. As the glass substrate, a substrate including soda lime glass, barium/strontium-containing glass, lead glass, alumino silicate glass, borosilicate glass, barium borosilicate glass or quartz and the like may be used, and as the polymer substrate, a substrate including polycarbonate (PC), an acryl resin, poly(ethylene terephthalate) (PET), poly(ether sulfide) (PES), or polysulfone (PS)

may be used, but the present invention is not limited thereto. In addition, as needed, the substrate may be a TFT substrate including a drive TFT.

Also, when the OED is a top-emissive OLED, the substrate does not need a transparent substrate. Here, as needed, a reflective layer using aluminum may be formed on a surface of the substrate.

The adhesive layer may be formed on at least one main surface of the substrate, and thus serve to maintain the conductive pattern. As the adhesive layer, various materials which can serve as described above may be used.

The adhesive layer may be, for example, a transparent adhesive layer, which includes an adhesive having a transmittance of 70% or more, 80% or more, 90% or more, 70 to 90%, or 70 to 99%, relative to light in a visible region, for example, in a wavelength range of 400 nm to 700 nm.

As the adhesive layer, an adhesive layer including a room-temperature curable, moisture curable, heat curable, active energy ray curable, or hybrid curable organic or inorganic adhesive may be used. The adhesive may include, for example, an adhesive resin such as an acrylic resin, a silicon resin, polyurethane, an epoxy resin, a fluorine resin, or a styrene resin, or a condensation reaction product of zirconium alkoxide, titanium alkoxide, or silicon alkoxide. The term "curing" used herein may refer to a process exhibiting physical properties capable of serving as an adhesive layer by a chemical or physical reaction or action of a component included in the reaction or action, and the term "room-temperature curable, moisture curable, heat curable, active energy ray curable, or hybrid curable adhesive" may refer to a type of adhesive cured through maintenance at a room temperature, application of moisture or heat, or radiation of an active energy ray, or by combining at least two methods thereof. In addition, here, the category of the term "active energy ray" may include a microwave, an IR ray, a UV ray, an X ray, a γ ray, and a particle ray such as an alpha-particle beam, a proton beam, a neutron beam or an electron beam and the like.

In one embodiment, in aspect of a process or convenience of embodiment of physical properties, as the adhesive layer, an adhesive layer including an active energy ray curable adhesive may be used.

In one embodiment, when the OED is formed on the planarized surface, the adhesive layer may be a highly refractive adhesive layer, for example, an adhesive layer having a refractive index which is the same as or similar to, or higher than that of the OED formed on the top of the planarized surface. In one embodiment, an absolute value of a difference in refractive index between the adhesive layer and the OED formed on the top of the planarized surface may be 1 or less, 0.8 or less, 0.6 or less, 0.4 or less or 0.2 or less. In one embodiment, the refractive index of the adhesive layer may be 1.6 or more, 1.7 or more, 1.8 or more or 1.9 or more. In this range of the refractive index, for example, when the OED is an OLED, light generated from the device may be efficiently incident to the adhesive layer by minimizing a total reflection phenomenon. In addition, the upper limit of the refractive index of the adhesive layer may be, but is not particularly limited to, for example, 4.0 or less, 3.5 or less, 3.0 or less, 2.5 or less or 2.0 or less, as long as it is similar to or higher than that of the OED.

A method of providing a high refractive index to the adhesive layer is not particularly limited. For example, a refractive index may be controlled using an adhesive increasing a refractive index of a matrix itself by including an aromatic group such as phenol in a structure, or introducing a monomer to which a halogen atom other than fluorine, a sulfur atom, a phosphorus atom, or a nitrogen atom is introduced, or a resin including the monomer as an adhesive resin for forming the adhesive layer or an additive of the adhesive layer, or by dispersing fine particles exhibiting a high refractive characteristic such as an oxide or hydrate of a metal such as titanium, zirconium, aluminum, indium, zinc, tin, or antimony in an adhesive. Here, a specific example of the monomer capable of exhibiting a high refractive index may be, but is not limited to, bis(4-methacryloyl thiophenyl)sulfide, vinyl naphthalene, vinyl phenyl sulfide, or 4-methacryloxy phenyl-4'-methoxy phenyl thioether.

The adhesive layer may further include scattering particles. The term "scattering particles" used herein may refer to particles having a different refractive index from that of the adhesive layer including the scattering particles. Such particles may be particles serving to scatter light incident to the adhesive layer. For example, when the refractive index of the adhesive layer is controlled to be similar to or higher than that of the OED as described above and the scattering particles are included, a ratio of inducing light generated from the device to an external environment, that is, light extraction efficiency may be enhanced. As the scattering particles, as long as they have a different refractive index from that of the adhesive layer, various organic particles, inorganic particles, or organic/inorganic combination particles may be used without particular limitation. The organic particles may be particles formed of an organic polymer such as polystyrene or a derivative thereof, an acrylic resin, a silicon resin, or a novolac resin, and the inorganic particles may be particles formed of a metal oxide such as silica, alumina, titania, or zirconia. Other than these, for example, fine particles having a core/shell structure, fine particles in which more fine particles are dispersed, or hollow particles may be used. For example, the scattering particles may have an average diameter of 0.2 μm to 20 μm, 0.5 μm to 15 μm or 1 μm to 10 μm.

Figure 3:
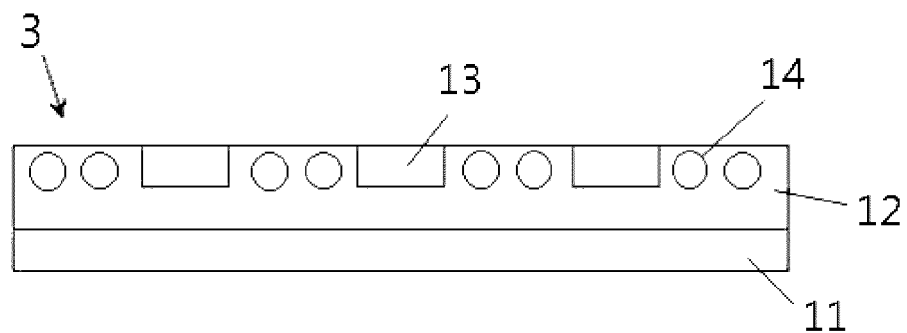

FIG. 3 shows a structure of an exemplary substrate (3), which includes a substrate (11), an adhesive layer (12) formed on the substrate (11), a conductive pattern (13) recessed in the adhesive layer (12), and scattering particles (14).

Figure 2:
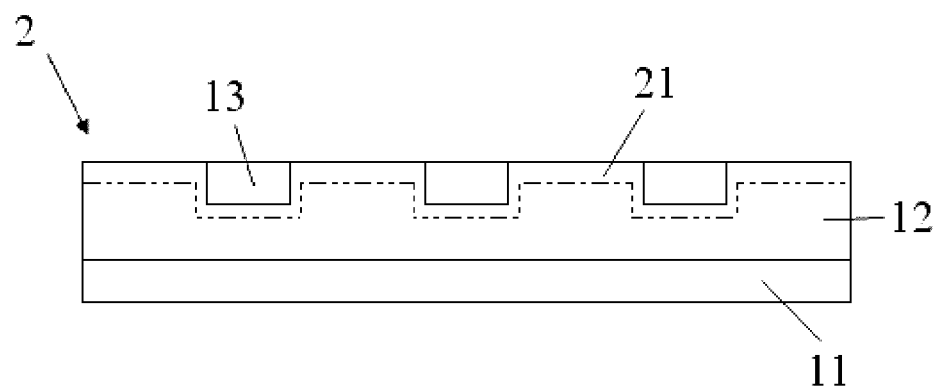

In one embodiment, the adhesive layer may further include a surface layer formed on an opposite surface thereof. FIG. 2 is a schematic diagram of an exemplary substrate (2) on which a surface layer (21) is formed.

In one embodiment, the surface layer may be a layer serving to control an adhesive strength to a releasable substrate in the process of manufacturing the substrate by a method to be described later. In this case, due to a suitable adhesive strength to a surface of the releasable substrate, the surface layer may be stably attached to the releasable substrate in the manufacturing process, and may be formed of a material capable of effectively removing the releasable substrate in the operation of removing the releasable substrate or having a high adhesive strength to the adhesive layer.

In one embodiment, the surface layer may include a material having a transmittance of 70% or more, 80% or more or 90% or more, relative to light in a visible region, particularly, in a wavelength of 400 nm to 700 nm and exhibiting the adhesive characteristics as described above.

The surface layer may include the above-described material, for example, an organic polymer such as polyester such as PC or PET, an acrylic resin, PES, an urethane resin, an epoxy resin, an olefin resin, PS, or polyimide, or an inorganic material such as silicon oxide such as $SiO_2$, silicon nitride or FeO and the like. The surface layer including such a material may be formed by a coating method such as wet coating, sputtering or vacuum deposition and the like.

In one embodiment, the surface layer may be a conductive surface layer formed of a conductive material or including a conductive material. In such a method, a sheet resistance of the opposite surface may be more efficiently controlled. As the conductive material capable of forming the surface layer or being included in the surface layer, for example, an electrically conductive material such as a conductive polymer such as a polythiophene-based polymer such as 3,4-polyethylenedioxithiophene (PEDOT) or a mixture of polystyrenesulfonate and PEDOT (PEDOT/PSS), polyacetylene, polypyrrole, polyaniline, polyfluorene, polytetrathiafulvalene, polynaphthalene, poly(p-phenylene sulfide), or poly(para-phenylene vinylene), a metal material such as silver, aluminum, copper, palladium, chromium, platinum, or gold, or silver, aluminum, copper, palladium, chromium, platinum, or gold which is doped with at least one selected from the group consisting of Ag, Au, Pd, Al, Pt, Cu, Zn, Cd, In, Si, Zr, Mo, Ni, Cr, Mg, Mn, Co, and Sn or an alloy thereof or a carbon nanotube and the like, and the surface layer using such a material may be formed by, for example, wet coating or deposition.

In the substrate, a conductive pattern is recessed in the adhesive layer. The conductive pattern is exposed to a surface of the adhesive layer opposite to the substrate, that is, a surface of the adhesive layer opposite to a surface in contact with the substrate, and is present as a part of the planarized surface. That is, the exposed surface of the conductive pattern and the surface of the adhesive layer are the same surface, which forms the planarized surface, and in one embodiment, when the adhesive layer includes the surface layer, a surface of the adhesive layer forming the planarized surface may be a surface of the surface layer.

Since the conductive pattern is exposed to the planarized surface, when an electrode of the OED is formed on the planarized surface, the electrode and the conductive pattern may be in contact with each other, and thus the sheet resistance of the electrode may be controlled in a suitable range as needed.

A shape of a pattern formed by exposing the conductive pattern to the planarized surface is not particularly limited, and may be controlled as needed. For example, when the planarized surface is observed from above, the exposure pattern may be a stripe type in which a plurality of exposed surfaces are disposed parallel to each other, a grid shape, an oblique line shape, or a honeycomb shape, or an amorphous shape, which is not a certain pattern.

Figure 4:
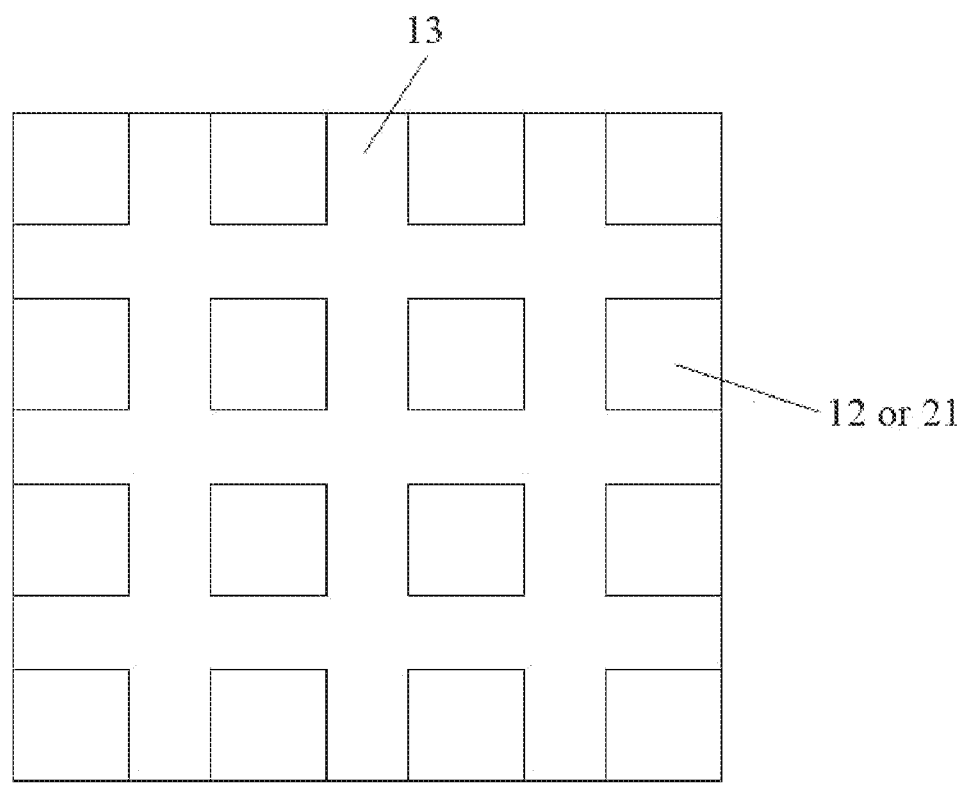
FIG. 4 is a diagram showing a shape of a conductive pattern exposed to a planarized surface of a substrate.

FIG. 4 shows a pattern of an exposed part of an exemplary conductive pattern (13), which forms a planarized surface together with an adhesive layer (12) or a surface layer (21).

In one embodiment, the sheet resistance of the planarized surface on which the conductive pattern is exposed may be 10 Ω/□ or less, and preferably 5 Ω/□ or less. However, the sheet resistance value is an example and thus may be changed, for example, by controlling an area of the conductive pattern exposed to the planarized surface or a depth of the exposed pattern or the conductive pattern recessed in the adhesive layer according to a desired value of the sheet resistance of an electrode.

In addition, an area of the conductive pattern exposed to the planarized surface is not particularly limited, and thus may be suitably controlled in consideration of, for example, a desired value of the sheet resistance of the electrode. In one embodiment, the area of the exposed conductive pattern may be 0.01% to 40%, 0.1% to 40% or 0.1% to 20% of the total area of the planarized surface. In this area ratio, the sheet resistance of the electrode may be effectively controlled through the conductive pattern, and total transparency of the substrate may be maintained at a suitable level.

A dimension of the conductive pattern may be controlled in consideration of a shape of the conductive pattern, a conductive material used in the conductive pattern or a desired value of the sheet resistance of an electrode. In one embodiment, the conductive pattern may have a thickness of 0.01 µm to 50 µm, 0.01 µm to 40 µm, 0.01 µm to 30 µm, 0.01 µm to 20 µm or 0.1 to 10 µm. Also, when the shape of the conductive pattern exposed to the planarized surface is a stripe shape or a predetermined pattern formed in a stripe shape, each stripe pattern may have a line width of 0.1 µm to 500 µm, 0.1 am to 400 µm, 0.1 µm to 300 µm, 0.1 µm to 200 µm or 1 µm to 100 µm.

In one embodiment, the conductive pattern may include a conductive polymer such as polythiophene such as PEDOT or PEDOT/PSS, polyacetylene, polypyrrole, polyaniline, polyfluorene, polytetrathiafulvalene, polynaphthalene, poly(p-phenylene sulfide) or poly(para-phenylene vinylene) and the like; a metal such as Ag, Al, Cu, Pd, Cr, Pt or Au and the like; an alloy material of at least two selected from the group consisting of Ag, Au, Pd, Al, Pt, Cu, Zn, Cd, In, Si, Zr, Mo, Ni, Cr, Mg, Mn, Co, and Sn; or a carbon-based material such as a carbon nanotube and the like.

For example, the conductive pattern including the above material may be formed by preparing a dry type or plasticized type conductive paste or ink using the above material and performing a printing method using the paste or ink as will be described later.

In the substrate, both of the exposed surface of the conductive pattern and a surface of the adhesive layer or the surface layer form the same surface, which is a planarized surface. The planarized surface may have a maximum height roughness of 1 µm or less, and preferably 0.5 µm or less. The term "maximum height roughness" used herein may refer to a distance between a straight line passing the maximum point of the roughness curve and a straight line passing the minimum point thereof, which is parallel to a central line in a roughness curve within a cut off. The maximum height roughness may be, for example, the maximum height roughness measured with respect to an arbitrary region of the planarized surface having an area of 100 µm². Here, the arbitrary region refers to a region having an area of 100 µm² randomly selected from the planarized surface of the substrate. That is, in a preferable embodiment, the planarized surface of the substrate only has a region having a maximum height roughness of 1 µm or less, and preferably 0.5 µm or less. Likewise, when the planarized surface has an excellent smoothness, the OED may be effectively formed on the planarized surface, and, for example, when the OED sequentially has an electrode, an organic layer, and an electrode on the planarized surface, a defect which is a short between the electrodes may be prevented. As the maximum height roughness of the planarized surface is lower, it means that the surface having excellent smoothness is formed, and thus the lower limit thereof is not particularly limited.

For example, the lower limit of the maximum height roughness may be 0 µm, 0.001 µm or 0.01 µm.

In one embodiment, the planarized surface may be a transfer surface of a surface of the releasable substrate. When the planarized surface is a transfer surface of the releasable substrate, the planarized surface having a more excellent smoothness can be formed.

The term "transfer surface of a releasable substrate" may refer to a surface to which a smoothness of the releasable substrate is transferred by removing the releasable substrate after the planarized surface formed of the exposed surface of the conductive pattern and the surface of the adhesive layer or the surface layer is previously formed in contact with a surface of the releasable substrate using the surface of the releasable substrate as a kind of template. Likewise, to configure the planarized surface as the transfer surface of the surface of the releasable substrate, for example, the planarized surface is formed by applying a manufacturing method to be described later.

In one embodiment, the substrate may further include a conductive layer formed on the planarized surface. The conductive layer may form, for example, a hole injection electrode or an electron injection electrode of the OED.

In one embodiment, the conductive layer may be formed of a material having transparency and a high work function to serve as a hole injection electrode. As such a material, ITO, IZO, ZnO, $SnO_2$ or $In_2O_3$ and the like may be used, and conventionally, ITO is used.

In another embodiment, the conductive layer may be formed of a material having transparency and a relatively low work function to serve as an electron injection electrode. As such a material, a metal such as K, Li, Na, Mg, La, Ce, Ca, Sr, Ba, Al, Ag, In, Sn, Zn or Zr and the like or an alloy of at least two components selected therefrom may be used. Here, the alloy may be Ag/Mg, Al/Li, In/Mg or Al/Ca and the like.

A thickness of the conductive layer may be suitably controlled in consideration of desired sheet resistance or light transmittance.

The substrate for an OED may be manufactured by, for example, forming a conductive pattern on a release surface of a releasable substrate; forming a precursor material of an adhesive layer on a substrate on which the conductive pattern is formed; laminating the precursor material of the adhesive layer and the substrate and converting the precursor material into the adhesive layer; and removing the releasable substrate.

Figure 5:
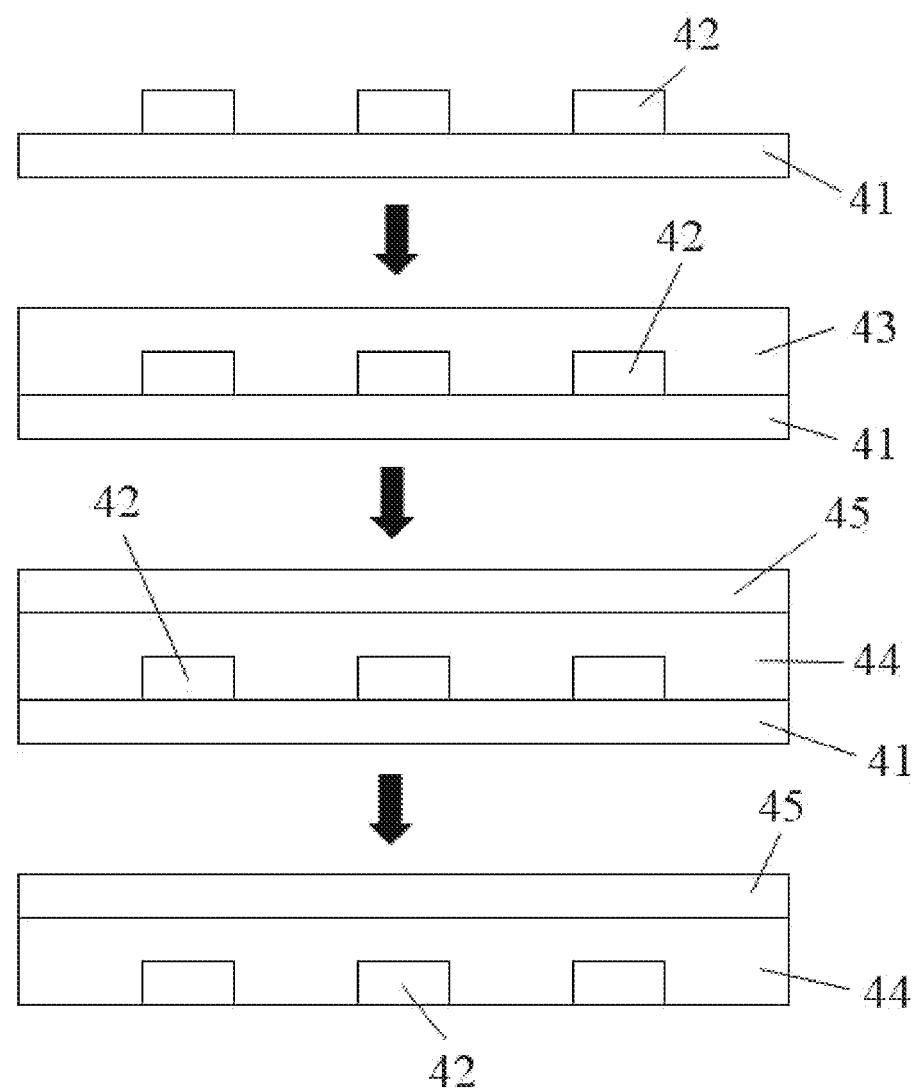
FIGS. 5 and 6 are schematic diagrams showing a method of manufacturing an exemplary substrate.

FIG. 5 is a schematic diagram illustrating the manufacturing method.

A kind of the releasable substrate (41) used in the manufacturing method is not particularly limited. As the releasable substrate, for example, a conventional film or sheet having a suitable peeling characteristic with respect to a conductive pattern and an adhesive layer or a surface layer on at least one surface, and also having excellent smoothness.

A conductive pattern (42) is formed on a release surface of the releasable substrate (41). In this operation, a method of forming the conductive pattern is not particularly limited, but may include, for example, preparing a dry or plasticized type conductive paste or ink using a material for forming a conductive pattern and applying the paste or ink to a printing method. As the printing method, for example, screen printing, inkjet printing, offset printing, gravure printing or reverse gravure printing and the like may be used.

Followed by the printing process, a necessary plasticizing or drying process may be performed according to the type of the paste or ink, thereby forming the conductive pattern.

After the conductive pattern (42) is formed, a precursor material (43) for the adhesive layer may be formed on a surface of the releasable substrate (41) having the pattern. The precursor material of the adhesive layer may be, for example, a material capable of forming the adhesive layer by the above-described curing reaction, and may be a room temperature curable, moisture curable, heat curable, active energy ray curable, or hybrid curable adhesive composition, or a sol-gel coating solution. The sol-gel coating solution may be prepared by, for example, dissolving a metal alkoxide such as zirconium alkoxide, titanium alkoxide, or silicon alkoxide in a solvent such as alcohol or water and the like, and suitably blending a catalyst with the resulting solution as needed. In addition, as described above, the precursor material may be a precursor material including a monomer in which highly refractive nano particles are dispersed or which is capable of expressing a high refractive index or a polymer including the monomer, and may further include the above-described scattering particles. A layer of the precursor material may be formed by coating such an adhesive composition or sol-gel coating solution on the releasable surface on which the conductive pattern is formed by a method of, for example, bar coating, spin coating, or gravure coating.

In one example, in the operation of forming a precursor material for the adhesive layer on the substrate on which the conductive pattern is formed, the precursor material of the adhesive layer may include scattering particles having a different refractive index from the adhesive layer. The scattering particles are as described above.

After the layer (43) of the precursor material is formed, the substrate (45) is laminated on the layer (43) of the precursor material, and in this state, the layer (43) of the precursor material may be converted into an adhesive layer (44). The conversion of the layer of the precursor material into the adhesive layer may be performed by inducing suitable curing according to the type of the precursor material used herein or a condensation reaction.

After the adhesive layer (44) is formed, the releasable substrate (41) may be peeled off, thereby manufacturing the substrate.

Figure 6:
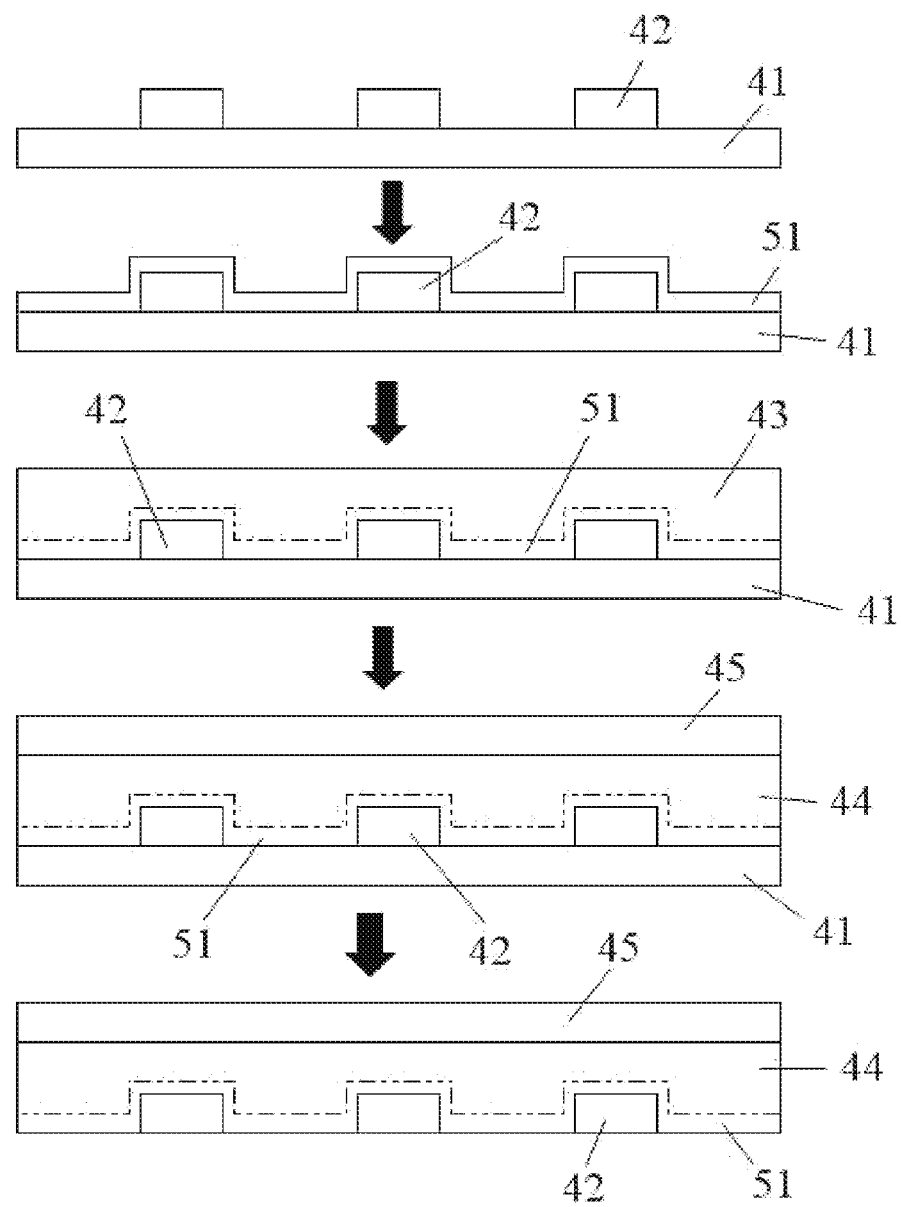

FIG. 6 shows another example of the manufacturing method further including forming the above-described surface layer (51) on the releasable substrate before the precursor material (43) for the adhesive layer is formed.

The exemplary manufacturing method shown in FIG. 6 may be performed by a similar method to the manufacturing method described in FIG. 5, except that the surface layer (51) is formed before the layer (43) of the precursor material of the adhesive layer is formed.

In addition, the surface layer (51) may be formed by, for example, a coating method such as wet coating using the above-described material for forming the surface layer, or a deposition method.

In the exemplary manufacturing method, after the releasable substrate is removed, an operation of forming the above-described conductive layer on a surface from which the releasable substrate is removed may be further performed.

A method of forming the conductive layer is not particularly limited, and a conventional method known in the art may be applied. For example, when the conductive layer is formed of a transparent conductive oxide (TCO) such as ITO or IZO, the conductive layer may be formed by a sputtering method such as pulse DC sputtering, or a wet coating or ion plating method. In addition, when the conductive layer is an electron injection electrode, the conductive layer may be formed by resistive heating deposition, electron beam-induced deposition, reactive deposition, ion plating, or sputtering.

The present invention also relates to an organic electronic system. The exemplary organic electronic system of the present invention may include the substrate and an OED formed on the planarized surface of the substrate.

In one embodiment, the OED may be an OLED. When the OED is an OLED, the OED may have, for example, a structure in which an organic layer including at least an emitting layer is interposed between a hole injection electrode and an electron injection electrode. In addition, the hole injection electrode or electron injection electrode may be the conductive layer formed on the planarized surface of the substrate described above.

The exemplary OLED may be formed in a type of (1) a hole injection electrode/an organic emitting layer/an electron injection electrode; (2) a hole injection electrode/a hole injection layer)an organic emitting layer/an electron injection electrode; (3) a hole injection electrode/an organic emitting layer/an electron injection layer/an electron injection electrode; (4) a hole injection electrode/a hole injection layer/an organic emitting layer/an electron injection layer/an electron injection electrode; (5) a hole injection electrode/an organic semiconductor layer/an organic emitting layer/an electron injection electrode; (6) a hole injection electrode/an organic semiconductor layer/an electron barrier layer/an organic emitting layer/an electron injection electrode; (7) a hole injection electrode/an organic semiconductor layer/an organic emitting layer/an adhesion-improving layer/an electron injection electrode; (8) a hole injection electrode/a hole injection layer/a hole transport layer/an organic emitting layer/an electron injection layer/an electron injection electrode; (9) a hole injection electrode/an insulating layer/an organic emitting layer/an insulating layer/an electron injection electrode; (10) a hole injection electrode/an inorganic semiconductor layer/an insulating layer/an organic emitting layer/an insulating layer/an electron injection electrode; (11) a hole injection electrode/an organic semiconductor layer/an insulating layer/an organic emitting layer/an insulating layer/an electron injection electrode; (12) a hole injection electrode/an insulating layer/a hole injection layer/a hole transport layer/an organic emitting layer/an insulating layer/an electron injection electrode; or (13) a hole injection electrode/an insulating layer/a hole injection layer/a hole transport layer/an organic emitting layer/an electron injection layer/an electron injection electrode, which are sequentially formed from the planarized surface of the substrate, and in some cases, the OLED may have an organic layer having a structure in which at least two emitting layers are divided by an inter-electrode having a charge generating characteristic or a charge generating layer (CGL) between a hole injection electrode and an electron injection electrode, but the present invention is not limited thereto.

Various materials for forming a hole or electron injection electrode and an organic layer, for example, an emitting layer, an electron injection or transport layer, or a hole injection or transport layer and methods of forming the same are known in the art, and all of the above-described methods may be applied to manufacture the organic electronic system.

Hereinafter, the present invention will be described in further detail with reference to Examples according to the present invention and Comparative Examples not according to the present invention, but the scope of the present invention is not limited to the following Examples.

In Examples, physical properties were measured by the following methods:

1. Measurement of Surface Roughness

Figure 9:
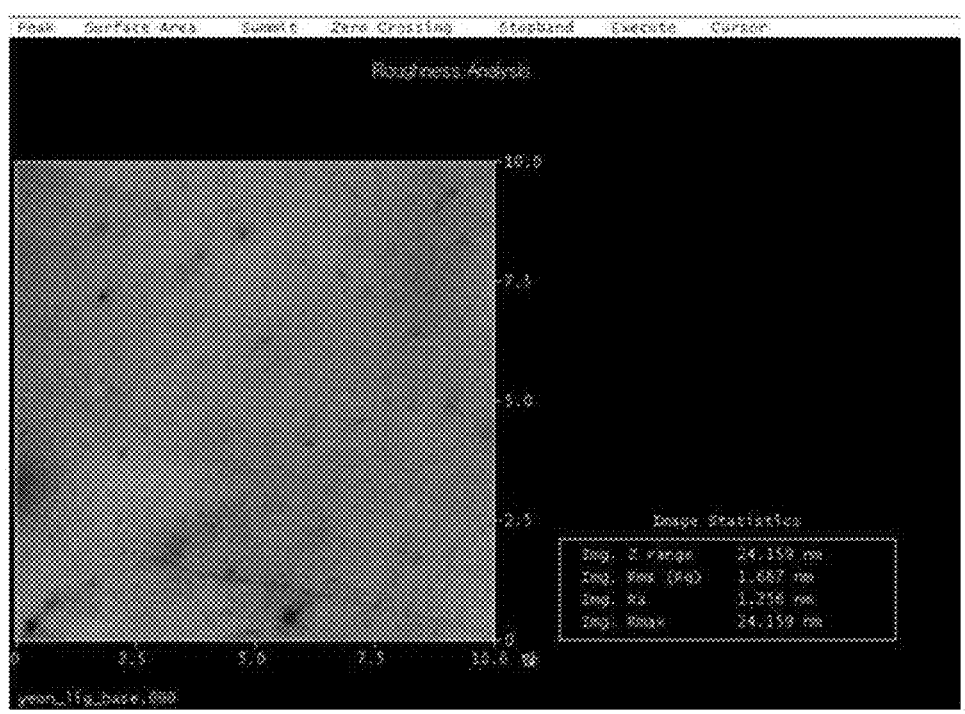
FIG. 9 is a diagram showing maximum height roughness of the substrates manufactured in Examples.

A surface roughness of a planarized surface of a substrate was measured in a tapping mode using an AFM apparatus (name: D3100, manufacturer: Digital Instrument), and a tip used herein had a radius of 8 nm. After three arbitrary regions having an area of 100 $\mu m^2$ were specified on the substrate, a surface roughness of the specified region was measured by the above-described method. In Table 1, average values of measurement results are listed. FIG. 9 shows an image of measuring the surface roughness of the substrate according to Example 1.

2. Measurement of Sheet Resistance of Substrate

A sheet resistance of the planarized surface of the substrate was measured using a 4-point probe (name: MCP-T610, manufacturer: MITSUBISHI CHEMICAL) conventionally used in sheet resistance measurement, which was an ESP-type probe having a gap between pins of 5 mm.

3. Measurement of Light Extraction Efficiency

Light extraction efficiency was evaluated by measuring luminous emittance of extracted light while an OLED was driven under a condition of a constant current of 20 mA. In the measurement of the luminous emittance, an amount of light emitted from the device was measured using an integrating sphere.

EXAMPLE 1

Figure 7:
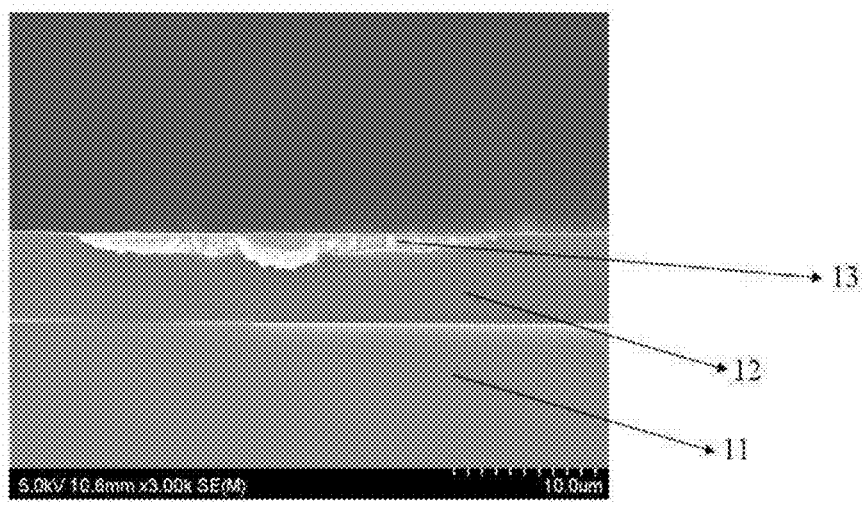
FIGS. 7 and 8 are diagrams of substrates manufactured in Examples.
Figure 8:
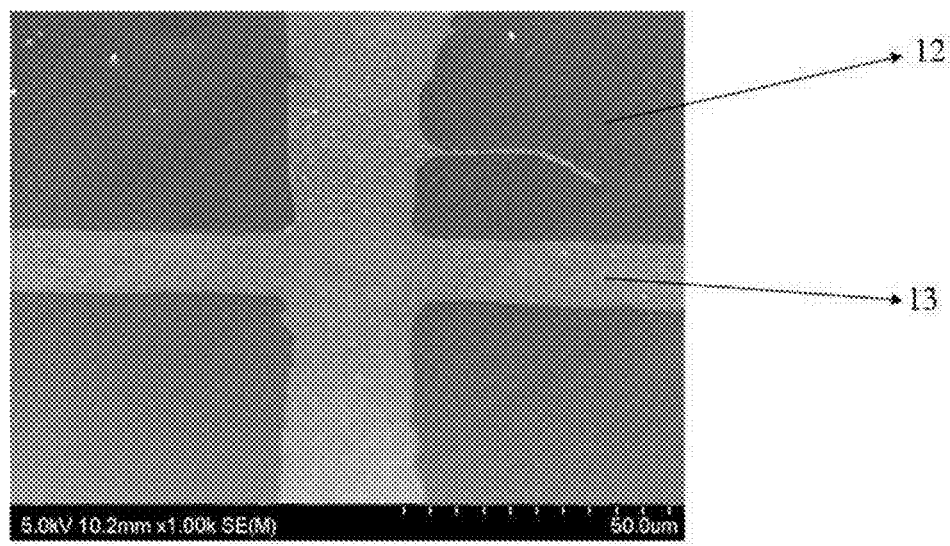

A grid-shaped conductive pattern was printed on a surface of a PET film which was not treated with a primer by an offset gravure printing method using an Ag paste. In this operation, a line width of the conductive pattern was controlled to 20 µm, and a gap between lines thereof was controlled to 280 µm, and a height thereof was controlled to approximately 1 µm. Afterward, the printed conductive pattern was plasticized at a temperature of 150° C. for about 30 minutes. Subsequently, a UV curable adhesive composition (NOA65, Norland Products Inc.) was coated on a surface of the PET film on which the conductive pattern was formed, and a glass substrate was laminated thereon and compressed with a rubber roller to sufficiently spread the composition. Afterward, an adhesive layer was formed by radiating a UV ray (2 J/cm$^2$) onto the composition. After the formation of the adhesive layer, the PET film was peeled off, thereby obtaining a substrate for an OED. FIGS. 7 and 8 show images of the manufactured substrates.

EXAMPLE 2

A substrate was manufactured by the same method as described in Example 1, except that, in the formation of a conductive pattern, a line width 40 µm, a gap between lines 260 µm, and a height about 2 µm were controlled.

EXAMPLE 3

A grid-shaped conductive pattern was printed on a surface of a PET film which was not treated with a primer by an offset gravure printing method using an Ag paste. In this operation, a line width of the conductive pattern was controlled to 20 µm, a gap between lines thereof was controlled to 280 µm, and a height thereof was controlled to approximately 1 µm. Afterward, the printed conductive pattern was plasticized at a temperature of 150° C. for about 30 minutes. Subsequently, a coating solution (TYT-80-01, Toyo ink) for forming a surface layer was coated on a surface of the PET film on which the conductive pattern was formed, dried at 100° C. for about 10 minutes, and cured by radiating a UV ray, thereby forming a surface layer. Subsequently, a UV curable adhesive composition (NOA65, Norland Products Inc.) was coated on a substrate on which the conductive pattern and the surface layer were formed, and a glass substrate was laminated thereon and compressed with a rubber roller to sufficiently spread the composition. Afterward, an adhesive layer was formed by radiating a UV ray (2 J/cm$^2$) onto the composition, and the PET film was peeled off, thereby obtaining a substrate for an OED.

Surface roughness and sheet resistance of the respective substrates manufactured in Examples 1 to 3 were measured, and measurement results are listed in Table 1.

TABLE 1

|  | Example 1 | Example 2 | Example 3 |
|---|---|---|---|
| Surface roughness (μm) | 0.20 | 0.27 | 0.21 |
| Sheet resistance (Ω/□) | 5.1 | 1.2 | 4.9 |

From the results of Table 1, it can be confirmed that a smoothness of the planarized surface becomes very excellent when the planarized surface is configured to a transfer surface of a releasable substrate. From the results of Table 1, it can be also confirmed that surface roughness and sheet resistance of the substrate becomes very excellent by controlling a material for forming a conductive pattern or a pattern thereof.

EXAMPLE 4

A substrate was manufactured by the same method as described in Example 1, except that 1 g of polymer beads (XX75BQ, radius: 3 μm, Sekisui) having a refractive index of about 1.52 was mixed, relative to 10 g of a UV curable adhesive.

EXAMPLE 5

A substrate was manufactured by the same method as described in Example 4, except that an amount of beads added to a UV curable adhesive was 1.5 g.

COMPARATIVE EXAMPLE 1

A substrate was manufactured by the same method as described in Example 1, except that a conductive pattern was not printed on a surface of a PET film.

An OLED was formed on each substrate manufactured in one of Examples 4 and 5, and Comparative Example 1, light extraction efficiency was compared and measured, and then results are shown in Table 2.

TABLE 2

|  | Example 4 | Example 5 | Comparative Example 1 |
|---|---|---|---|
| Luminous emittance (lm) | 4.48 | 4.30 | 2.37 |

Referring to Table 2, it is seen that, in Examples 4 and 5 according to an exemplary embodiment of the present invention, luminous emittance is considerably higher than that in Comparative Example 1 not including a conductive pattern and scattering particles. Accordingly, it can be noted that internal light extraction efficiency is enhanced due to a scattering layer including scattering particles.

INDUSTRIAL APPLICABILITY

The substrate according to the present invention may be used various type of the substrate for an OED.

EXPLANATION OF MARKS 1,2: substrate for an OED
11: substrate
12: adhesive layer
13: conductive pattern
14: scattering particles
21: surface layer
41: releasable substrate
42: conductive pattern
43: precursor material of adhesive layer
44: adhesive layer
45: substrate
51: surface layer

The invention claimed is:

1. A method of manufacturing a substrate for an OED, comprising:
   forming a conductive pattern directly on a release surface of a releasable substrate;
   forming a precursor material layer for an adhesive layer directly on the conductive pattern and a surface of the releasable substrate having the conductive pattern, the precursor material layer comprising a high refractive coating solution comprising an organic or inorganic binder and scattering particles;
   laminating a second substrate directly on the precursor material layer; and
   converting the precursor material layer into an adhesive layer,
   wherein the conductive pattern is formed to be exposed to a surface of the adhesive layer opposite to a surface of the adhesive layer attached to the second substrate, and the surface of the adhesive layer, which includes the exposed conductive pattern, is a planarized surface having a maximum height roughness of 1 μm or less, and
   wherein the conductive pattern is formed to have a ratio of an area of the conductive pattern exposed to the planarized surface to be 0.1% to 40% of a total area of the planarized surface, for the substrate for an OED to have a sheet resistance of the planarized surface of 5 Ω/□ or less.

2. The method of manufacturing a substrate for an OED of claim 1, wherein forming the precursor material layer and converting the precursor material layer into an adhesive layer comprises:
   applying the high refractive coating solution on the conductive pattern and the surface of the releasable substrate having the conductive pattern;
   drying the applied high refractive coating solution; and
   curing the dried high refractive coating solution.

3. The method of manufacturing a substrate for an OED of claim 1, further comprising removing the releasable substrate.

4. The method of manufacturing a substrate for an OED of claim 1, wherein:
   the forming the conductive pattern directly on the release surface of the releasable substrate is performed before the forming the precursor material layer for the adhesive layer directly on the conductive pattern and the surface of the releasable substrate having the conductive pattern;
   the forming the precursor material layer for the adhesive layer directly on the conductive pattern and the surface of the releasable substrate having the conductive pattern is performed before the laminating the second substrate on the precursor material layer; and the laminating the second substrate on the precursor material layer is performed before the converting the precursor material layer into the adhesive layer.

5. The method of manufacturing a substrate for an OED of claim 4, further comprising: removing the releasable substrate; and wherein the converting the precursor material layer into the adhesive layer is performed before the removing the releasable substrate.

6. The method of manufacturing a substrate for an OED of claim 5, wherein the forming the precursor material layer for the adhesive layer on the conductive pattern and the surface of the releasable substrate having the conductive pattern comprises coating the high refractive coating solution on the conductive pattern and the precursor material layer for the adhesive layer on the conductive pattern.

7. The method of manufacturing a substrate for an OED of claim 6, wherein the coating comprises bar coating, spin coating, or gravure coating.

8. The method of manufacturing a substrate for an OED of claim 1, wherein the forming the precursor material layer for the adhesive layer on the conductive pattern and the surface of the releasable substrate having the conductive pattern comprises coating the high refractive coating solution on the conductive pattern and the precursor material layer for the adhesive layer on the conductive pattern.

9. The method of manufacturing a substrate for an OED of claim 8, wherein the coating comprises bar coating, spin coating, or gravure coating.

* * * * *